(12) United States Patent
Konno et al.

(10) Patent No.: US 7,618,267 B2
(45) Date of Patent: Nov. 17, 2009

(54) ANISOTROPIC CONDUCTIVE CONNECTOR AND ANISOTROPIC CONDUCTIVE CONNECTOR CONNECTION STRUCTURE

(75) Inventors: Hideaki Konno, Tokyo (JP); Takashi Nakagawa, Sano (JP)

(73) Assignee: Polymatech Co., Ltd., Tokyo (JP)

( * ) Notice: Subject to any disclaimer, the term of this patent is extended or adjusted under 35 U.S.C. 154(b) by 0 days.

(21) Appl. No.: 12/192,316

(22) Filed: Aug. 15, 2008

(65) Prior Publication Data

US 2009/0053907 A1   Feb. 26, 2009

(30) Foreign Application Priority Data

Aug. 21, 2007   (JP) ............................ 2007-214597

(51) Int. Cl.
*H01R 4/58* (2006.01)
(52) U.S. Cl. ....................................................... 439/91
(58) Field of Classification Search ................... 439/66, 439/91
See application file for complete search history.

(56) References Cited

U.S. PATENT DOCUMENTS

2009/0039905 A1* 2/2009 Kimura et al. .............. 324/754

FOREIGN PATENT DOCUMENTS

| JP | 2003-347755 | 12/2003 |
| JP | 2004-004093 | 1/2004 |
| JP | 2006-261099 A | 9/2006 |

* cited by examiner

*Primary Examiner*—Javaid Nasri
(74) *Attorney, Agent, or Firm*—Cermak Kenealy Vaidya & Nakajima LLP; Tomoko Nakajima (57) ABSTRACT

An anisotropic conductive connector includes: a plurality of conducting paths to be brought into contact with a first object of connection provided in an electronic apparatus and with a second object of connection separate from the first object of connection to effect conductive connection between the objects of connection; and a metal portion to be brought into contact with the conducting paths to effect conductive connection between the plurality of conducting paths.

18 Claims, 7 Drawing Sheets

ANISOTROPIC CONDUCTIVE CONNECTOR AND ANISOTROPIC CONDUCTIVE CONNECTOR CONNECTION STRUCTURE

This application claims the priority benefit under 35 U.S.C. § 119 of Japanese Patent Application No. 2007-214597 filed on Aug. 21, 2007, which is hereby incorporated in its entirety by reference.

BACKGROUND OF THE INVENTION

1. Field of the Invention

The present invention relates to a technology for effecting grounding connection between an object of connection continuous with a metal portion of an electronic component or the like contained in an electronic apparatus such as a mobile phone, a personal digital assistant, a mobile music player, or a vehicle-mounted apparatus, and an object of connection continuous with another metal portion.

2. Description of the Related Art

Some mobile electronic apparatuses such as a mobile phone and a personal digital assistant use an electronic component and a member having metal portions. When a mobile electronic apparatus has metal portions, there is a fear of a difference in potential being generated between one metal portion and the other metal portion and noise being generated within the electronic apparatus, and hence it is necessary to effect grounding connection between the metal portion and the other metal portion.

As technologies related to this grounding, there are known, for example, the following three conventional technologies. According to the first technology, which is disclosed in JP 2004-4093 A, there is used a sponge with conductive cloth formed by cylindrically wrapping a conductive cloth formed of a non-woven cloth or knitted cloth using conductive yarns around a core material with flexibility such as sponge. In the second technology, which is disclosed in JP 2003-347755 A, there is used a grounding spring formed of a metal piece. In the third technology, which is disclosed in JP 2003-347755 A, there is used a columnar conductive silicone elastomer member in which a conductive filler such as silver particles is uniformly dispersed all over.

The sponge with conductive cloth of the first technology is press-held between a metal portion of a casing and a grounding portion of a circuit board. It should be noted, however, that it is rather difficult to press-hold a small sponge with conductive cloth between the casing and the board at a predetermined position. Further, due to its rather poor dimensional precision, the size of the sponge sometimes exceeds the accommodation space acceptable for the mobile electronic apparatus, which is required to be as small as possible. Further, it only allows production in a simple configuration such as a rectangular prism, and hence it cannot be applied to ground connection which involves a complicated configuration.

The grounding spring of the second technology, which is formed of a metal piece, is also press-held between the metal portion of the casing and the grounding portion of the circuit board. However, the small grounding spring, which is formed of a metal piece, is subject to deformation, and when it is excessively deformed, it cannot be restored to the former shape, thus failing to perform ground connecting function. Further, the grounding spring is held in point contact with the ground connecting portion, and hence it is not always to be expected to exhibit a sufficient conduction characteristic.

The silicone rubber of the third technology is also press-held between the casing metal portion and the grounding portion of the circuit board. It should be noted, however, that it is rather difficult to press-hold the small columnar conductive silicone rubber member between the casing and the board at a predetermined position. Further, for the conductive silicone rubber to provide a satisfactory conduction characteristic, it is necessary to uniformly disperse a large amount of conductive filler in the silicone rubber serving as the base material. However, when the amount of conductive filler is larger, the silicone rubber becomes rather hard, fragile, and subject to chipping.

SUMMARY OF THE INVENTION

The present invention has been made in view of the above-mentioned problems in the prior art. It is accordingly an object of the present invention to provide a grounding technology which provides the requisite conduction characteristic for ground connection even with a small grounding area. Another object of the present invention is to provide a grounding technology which facilitates the mounting operation.

The present invention which achieves the above-mentioned object is constructed as described below. That is, the invention provides an anisotropic conductive connector including a plurality of conducting paths formed by magnetic conductive particles oriented in a predetermined direction, and an insulating portion formed of a rubber-like elastic member covering the conducting paths, conduction being effected by bringing both end surfaces of each conducting path into contact with objects of connection to be brought into conductive connection, the present invention provides an anisotropic conductive connector further including a metal portion having a plurality of through-holes and crossing the conducting paths, in which the magnetic conductive particles of the conducting paths pass through the through-holes, and in which hole edges of the through-holes have contact surfaces in contact with the magnetic conductive particles to effect conductive connection with the metal portion.

In the anisotropic conductive connector which has a plurality of conducting paths formed by orienting magnetic conductive particles in a predetermined direction and an insulating portion formed of a rubber-like elastic member covering the conducting paths and which effects conduction by bringing the end surfaces of the conducting paths into contact with the object of connection for conductive connection, there is provided a metal portion having a plurality of through-holes and crossing the conducting paths, with the magnetic conductive particles of the conducting paths passing through the through-holes, and with contact surfaces in contact with the magnetic conductive particles being formed at the hole edges of the through-holes to effect conductive connection with the metal portion, and hence it is possible to reduce the area of the end surface of each conducting path. Accordingly, when each end surface is small, since there are provided a plurality of end surfaces, and the conducting paths with the end surfaces are electrically continuous with each other, it is possible to obtain a sufficient conduction characteristic. Further, grounding is also possible for an object of connection having scarcely any space and hence providing no grounding place when the conducting path end surface is large.

Further, it is possible to arrange the conducting paths such that the central axes in the orientation direction of the conducting paths are offset from the centers of the through-holes, causing a part of the conducting paths to pass through a part of the through-holes and enabling the remainder of the conducting paths to overlap the hole edges of the through-holes. Since the conducting paths are arranged such that the central axes in the orientation direction of the conducting paths are offset from the centers of the through-holes, with a part of the conducting paths passing through a part of the through-holes, the magnetic conductive particles forming the conducting paths are not intercepted by the conduction sheet with a metal portion, and continuous orientation is possible through the through-holes, making it possible to reliably effect conductive connection on the objects of connection connected to the end surfaces of the conducting paths. Further, since the conducting paths are arranged such that the central axes in the orientation direction of the conducting paths are offset from the centers of the through-holes, with the remainder of the conducting paths overlapping the hole edges of the through-holes, the overlapping portions form contact surfaces of the conducting paths and the through-holes, making it possible to reliably effect conductive connection on the conducting paths and the through-holes.

Further, the diameter of the conducting paths may be larger than the diameter of the through-holes, and the conducting paths may be arranged such that the central axes in the orientation direction of the conducting paths are substantially coaxial with the centers of the through-holes, with a part of the conducting paths stopping the through-holes while extending therethrough, and with the remainder of the conducting paths overlapping the hole edges of the through-holes. Since the diameter of the conducting paths is larger than the diameter of the through-holes, and the conducting paths are arranged such that the central axes in the orientation direction of the conducting paths are substantially coaxial with the centers of the through-holes, with a part of the conducting paths stopping the through-holes while extending therethrough, the magnetic conductive particles forming the conducting paths are not intercepted by the conduction sheet with a metal portion, and it is possible to effect continuous orientation through the through-holes, making it possible to reliably effect conductive connection on the objects of connection connected to the end surfaces of the conducting paths. Further, since the remainder of the conducting paths overlap the hole edges of the through-holes, the overlapping portions form contact surfaces of the conducting paths and the through-holes, making it possible to reliably effect conductive connection on the conducting paths and the through-holes.

The metal portion may be formed of a metal layer provided on a base member formed of a resin film, a resin plate or the like, or a metal layer provided on a laminate sheet such as a circuit board. Examples of the metal layer may include various forms of metal such as a metal foil, a metal deposit layer, a metal thin plate, and a metal sheet. Since it is a metal layer provided on a laminate sheet, the metal layer is thin, and stability in form, which cannot be attained with the metal layer alone, can be supplemented by the resin portion of the base member or the circuit board. Further, tear strength, which is rather insufficient with the metal layer alone, can be supplemented by the metal portion of the base member or the circuit board, thus achieving an improvement in terms of handling property. Further, the metal layer can be formed thin, making it possible to meet the requirement for a reduction in the weight and thickness of the anisotropic conductive connector.

Further, it is possible to provide a base body portion having a metal portion and an insulating portion formed of a rubber-like elastic member covering the metal portion and extending to cross the conducting paths, and at an end of this base body portion, it is possible to provide a ground connection portion where the metal portion is exposed for contact with the objects of connection. Due to the provision of this ground connection portion, it is possible to effect connection with the objects of connection not only with the end surfaces of the conducting paths but also with the ground connection portion, thus making it possible to reliably effect conductive connection.

The ground connection portion may be formed by folding back the metal portion. Since the ground connection portion is formed by folding back the metal portion, when a conduction sheet formed by stacking a metal portion on a resin film or the like is used, the metal portion is exposed on both surfaces of the ground connection portion by folding back the metal portion with the resin film side on the inner side, making both sides of the ground connection portion conductive. By doing so, it is possible to connect both sides of the ground connection portion with the objects of connection to effect conduction thereof.

The present invention may provide a connection structure of an anisotropic conductive connector, including an anisotropic conductive connector as described above and objects of connection to be brought into conductive connection through the anisotropic conductive connector, in which conduction is effected by bringing both end surfaces of each conducting path into contact with the objects of connection and by bringing both surfaces of the ground connection portion into contact with the objects of connection.

Since both end surfaces of the conducting paths are held in contact with the objects of connection, and both sides of the ground connection portion are held in contact with the objects of connection to effect conduction, even when the conductivity attained through the conductive connection of the conducting paths and the objects of connection is insufficient, it is possible to secure the requisite conductivity with the ground connection portion, making it possible to attain conduction with the objects of connection more reliably.

Regarding the connection structure of the anisotropic conductive connector, there is further provided a spacer having accommodation recesses for accommodating the conducting paths protruding from the base body portion of the anisotropic conductive connector, and the conducting paths of the anisotropic conductive connector are engaged with the accommodation recesses of the spacer to integrate the anisotropic conductive connector with the spacer, and, in this state, the anisotropic conductive connector is brought into contact with the objects of connection to effect conduction.

Due to the construction in which there is further provided the spacer having the accommodation recesses for accommodating the conducting paths protruding from the base body portion of the anisotropic conductive connector and in which the conducting paths of the anisotropic conductive connector are engaged with the accommodation recesses of the spacer to integrate the anisotropic conductive connector with the spacer, with the anisotropic conductive connector being brought into contact with the objects of connection in this state to effect conduction, it is possible to mount this anisotropic conductive connector easily and reliably between the object of connection on one side and the object of connection on the other side.

In the anisotropic conductive connector of the present invention, even though it is possible to reduce the connection area for each object of connection, it is possible to realize reliable conductive contact, making it possible to realize the requisite conduction characteristic for removing electromagnetic wave noise and static electricity.

In the anisotropic conductive connector connection structure of the present invention, the mounting operation can be conducted easily. Further, it is possible to prevent positional deviation and detachment of the anisotropic conductive connector.

The anisotropic conductive connector of the present invention and the connection structure thereof are suitably applicable to small mobile electronic apparatuses such as a mobile phone, a PDA, and a mobile audio apparatus.

The above description of this invention should not be construed restrictively, and the advantages, features, and uses of this invention become more apparent from the following description given with reference to the accompanying drawings. Further, it should be understood that all appropriate modifications made without departing from the gist of this invention are to be covered by the scope of this invention.

DETAILED DESCRIPTION OF THE PREFERRED EMBODIMENTS

Figure 1:
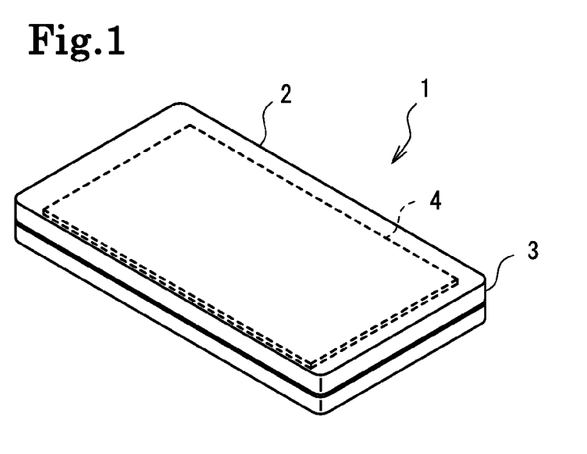
FIG. 1 is a schematic external perspective view of a mobile music playback apparatus equipped with an anisotropic conductive connector according to the present invention.

Embodiments of the anisotropic conductive connector according to the present invention are described with reference to the drawings. In the drawings, the reference numerals indicate portions and components. In the following embodiments, there is exemplified a case where an anisotropic conductive connector is incorporated into an electronic apparatus, for example, a small mobile electronic apparatus, in particular, a mobile music playback apparatus 1 as shown in FIG. 1, and a metal portion 3 constituting a part of a casing 2 of the mobile music playback apparatus 1 is grounded with respect to a built-in circuit board 4. In the present specification, for the sake of convenience in illustration, the upper and lower sides of the anisotropic conductive connector correspond to the upper and lower sides as depicted in the drawings, however, in the actual use, the grounding direction can be varied as appropriate, and the upper and lower sides are not necessarily the same as those of the present specification. Regarding the structures, the materials, the manufacturing method that are common to the embodiments, a redundant description thereof is omitted.

Figure 2:
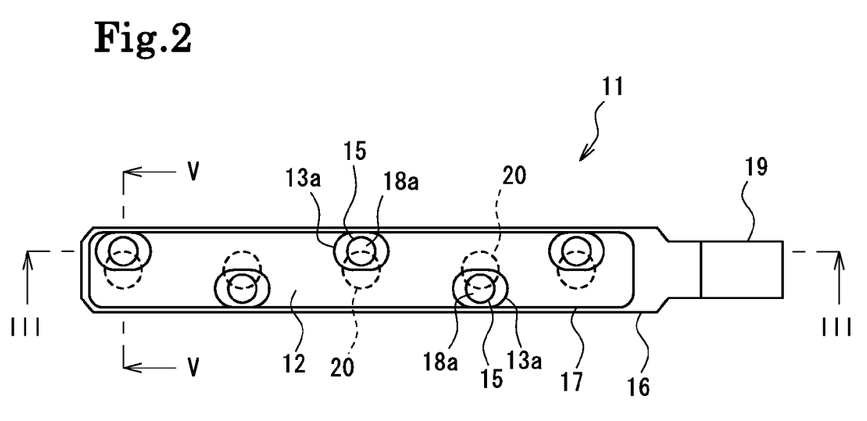
FIG. 2 is a plan view of an anisotropic conductive connector according to the present invention.
Figure 3:
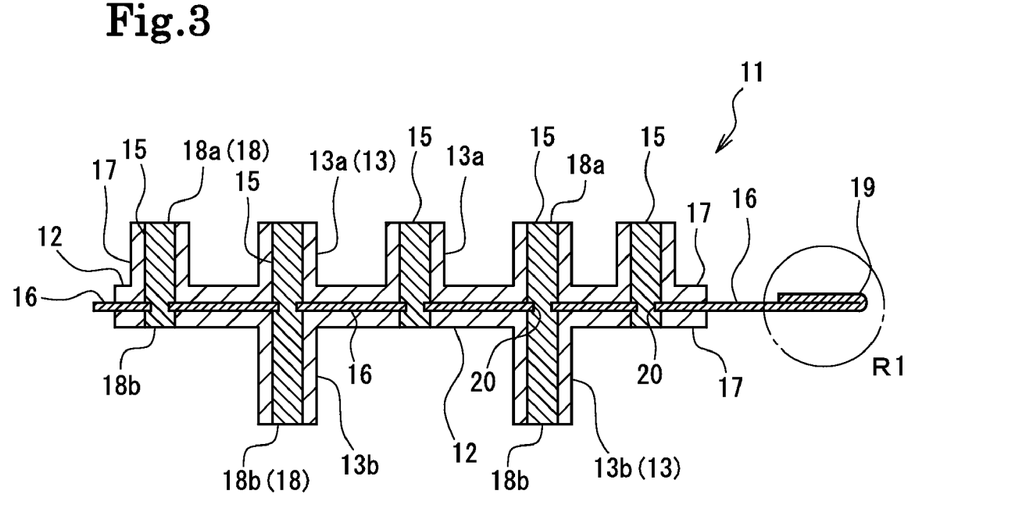
FIG. 3 is a sectional view of the anisotropic conductive connector of FIG. 2, taken along the line III-III along the center of a protrusion thereof.
Figure 4:
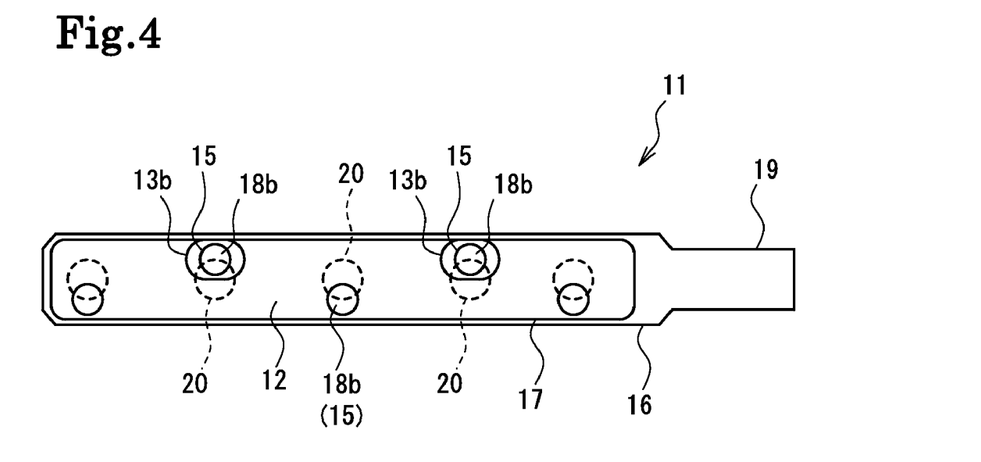
FIG. 4 is a bottom view of the anisotropic conductive connector of FIG. 2.
Figure 5:
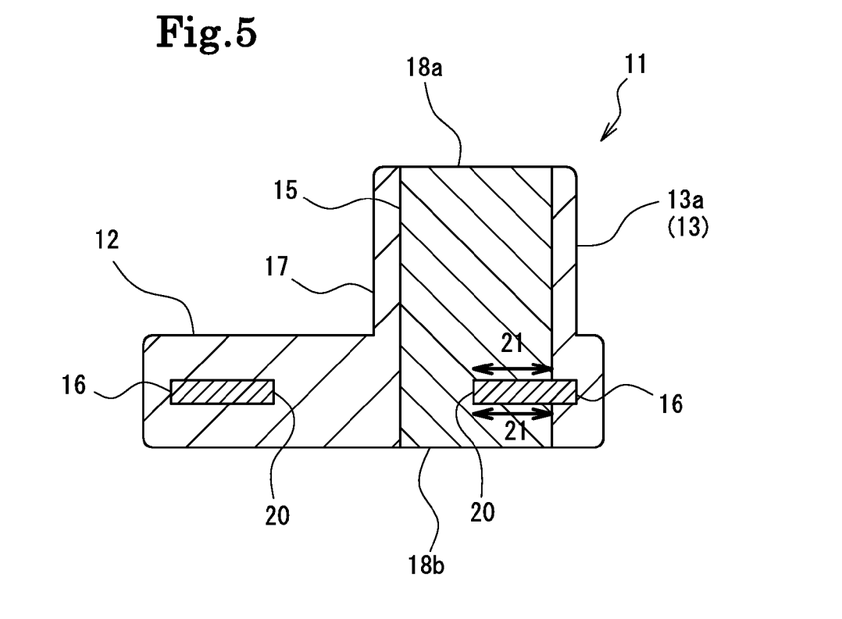
FIG. 5 is an enlarged sectional view of the anisotropic conductive connector of FIG. 2, taken along the line V-V.

First Embodiment (FIGS. 2 through 5): FIG. 2 is a plan view of an anisotropic conductive connector 11 according to this embodiment, FIGS. 3 and 5 are sectional views of the same, and FIG. 4 is a bottom view of the same. In terms of structure, the anisotropic conductive connector 11 has a plurality of protrusions 13 (upper side protrusions 13a and lower side protrusions 13b) vertically protruding from a base body portion 12 expanding in a plate-like fashion in the thickness direction thereof. In terms of function, the anisotropic conductive connector 11 has conducting paths 15 for effecting conduction between one side (e.g., the upper side) and the other side (e.g., the lower side) of the anisotropic conductive connector 11, a conduction sheet 16 having a metal portion 16a effecting conduction between the conducting paths 15, and an insulating portion 17 covering the conducting paths 15 and the conduction sheet 16 and preventing exposure of the conductive portions to insulate them from the exterior.

The conducting paths 15, in which magnetic conductive particles are linked together and oriented in the vertical direction of the anisotropic conductive connector 11, are formed to extend through the base body portion 12 and the protrusions 13. The end surfaces where the conducting paths 15 are vertically exposed form electrode surfaces 18 (upper side electrode surfaces 18a and lower side electrode surfaces 18b). The plate-like conduction sheet 16 is contained in the plate-like base body portion 12 to extend in the planar direction of the anisotropic conductive connector 11. Further, the conducting paths 15 and the conduction sheet 16 are in conductive contact with each other, enabling conduction between the plurality of conducting paths 15 and the conduction sheet 16. This contact structure is described in detail below. The insulating portion 17 covers the portions around the conducting paths 15 and the upper and lower surfaces of the conduction sheet 16 except for the electrode surfaces 18, and at one end in the planar direction (the direction crossing the thickness direction) of the base body portion 12, no insulating portion 17 is provided, forming a ground connection portion 19 where the conduction sheet 16 is exposed.

The portions where the conducting paths 15 and the conduction sheet 16 cross each other are described with reference to FIG. 5. The center of each conducting path 15, in which magnetic conductive particles are oriented, is somewhat offset with respect to a through-hole 20 of the conduction sheet 16. That is, each conduction path 15 is arranged such that the central axis extending in the orienting direction of the conducting path 15 is offset from the center of the through-hole 20, a part of the conducting path 15 passes through a part of the through-hole 20, and, except for the portion where the through-hole 20 is passed through, the conducting path 15 is also formed on the upper and lower surfaces of the conduction sheet 16 so as to overlap the hole edge of the through-hole 20. In this way, there are secured contact surfaces 21 between the conduction sheet 16 and each conducting path 15. As shown in FIGS. 2 and 4, the through-holes 20 are formed in the center line of the anisotropic conductive connector 11, whereas the protrusions 13 are somewhat deviated in the vertical direction from the center line to be arranged in a zigzag fashion.

Figure 6A:
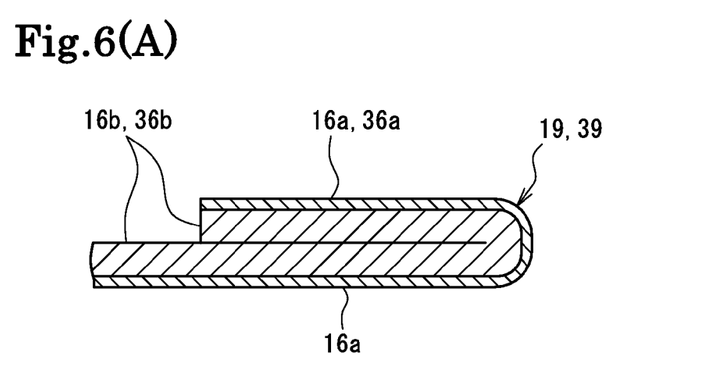
FIGS. 6(A) and 6(B) are enlarged views of the region R1 of FIG. 3 and the region R2 of FIG. 11.
Figure 6B:
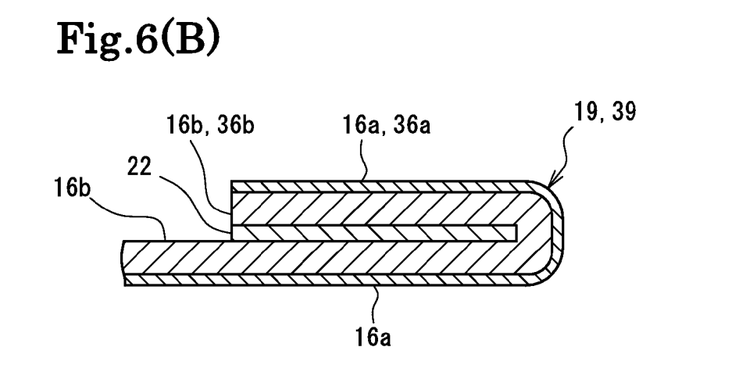

The ground connection portion 19 is formed by folding back and laminating an end portion of the conduction sheet 16. As shown in FIG. 6(A), the laminated portion of the region RI may be formed by simply folding back and laminating the end portion. However, as shown in FIG. 6(B), in order that the portion folded back may not be restored to the former state, it is desirable for the portion folded back to be fixed in position by a double-faced tape 22 or the like. The conduction sheet shown in FIGS. 6(A) and 6(B) is formed by providing a metal layer 16a on a resin film 16b described below.

Next, the material of each portion is described. As the magnetic conductive particles forming the conducting paths 15, it is possible to use particles exhibiting ferromagnetism and conductivity. Examples of the particles include particles of a ferromagnetic metal such as nickel, cobalt, or iron and an alloy containing the same. Apart from this, it is also possible to use particles obtained by covering a ferromagnetic metal such as nickel, cobalt, iron, or ferrite with a highly conductive metal, or particles obtained by covering the surfaces of conductive or insulating particles with nickel, cobalt, iron or the like. Above all, particles obtained by covering a ferromagnetic material with a highly conductive metal are preferable. Examples of the highly conductive metal include metals such as gold, silver, platinum, aluminum, copper, palladium, and chromium, and alloys such as stainless steel.

The conduction sheet 16 may be formed of a metal thin plate or a metal sheet having conductivity and formed as a flat plate. In this case, the conduction sheet 16 constitutes the metal portion. Examples of the metal that can be used include highly conductive metals such as gold, silver, copper, aluminum, and stainless steel. As the conduction sheet 16, it is possible to use a laminate film or a laminate plate obtained by stacking a metal layer such as a metal foil, a metal deposit layer, the above-mentioned metal thin plate or metal sheet on the base material such as the resin film 16b or the resin plate 16b, or a laminate sheet 16 such as a circuit board obtained by attaching a copper foil to a glass epoxy sheet or a paper phenol sheet. By using the laminate resin film 16b or the laminate resin plate 16b, or by using a circuit board, it is possible to achieve an improvement in terms of the tear strength and handling property of the conduction sheet 16. Examples of the resin film 16b and the resin plate 16b include a polyethylene terephthalate film, a polyurethane film, a polyamide film, a polypropylene film, a polystyrene film, a fluorine film, an ionomer film, a polycarbonate film, a polyvinyl chloride film, and the like. In addition to these, examples may include resin materials in film-form or plate-form having resins such as paper phenol impregnated therein.

The insulating portion 17 is formed of an insulating rubber-like elastic material. As the rubber-like elastic material forming the insulating portion 17, it is possible to use a curing type or a melting type rubber-like elastic material. Examples of the curable type include, a silicone rubber, a natural rubber, an isoprene rubber, acrylonitrile butadiene rubber, a 1,2-polybutadiene rubber, a styrenebutadiene rubber, a chloroprene rubber, a nitrile rubber, a butyl rubber, an ethylene-propylene rubber, a chlorosulfone rubber, a polyethylene rubber, an acrylic rubber, an epichlorohydrin rubber, a fluororubber, a urethane rubber, and the like. Examples of the melting type include a styrene-based thermoplastic elastomer, an olefin-based thermoplastic elastomer, an ester-based thermoplastic elastomer, a urethane-based thermoplastic elastomer, an amido-based thermoplastic elastomer, a vinylchloride-based thermoplastic elastomer, a fluoride-based thermoplastic elastomer, an ion crosslinking-based thermoplastic elastomer, and the like. Of these rubber-like elastic materials, from the viewpoint of molding workability, electrical insulation property, and weather resistance, it is desirable to use a curing type liquid silicone rubber. It is necessary for the viscosity of this rubber-like elastic material at the time of molding to be one allowing the contained magnetic conductive particles to be caused to flow by a magnetic field. Under the temperature condition at the time of molding, the viscosity ranges preferably from 1 Pa·s to 250 Pa·s and, more preferably, from 10 Pa·s to 100 Pa·s.

The content of the magnetic conductive particles in the liquid rubber or the heat-meltable rubber-like elastic material preferably ranges from 5 parts by weight to 100 parts by weight with respect to 100 parts by weight of the rubber-like elastic material. When the content is less than 5 parts by weight, there is a fear of the connection between the magnetic conductive particles being rather insufficient and hence the conducting paths 15 extending through the wall thickness of the base body portion 12 not being formed, whereas, when it exceeds 100 parts by weight, the viscosity of the material in the liquid state or the molten state is too high, and there is a fear of the magnetic conductive particles not being oriented to a sufficient degree.

A method of manufacturing the anisotropic conductive connector 11 is described. First, the through-holes 20 constituting the conducting paths 15 are formed in the conduction sheet 16. This sheet with the through-holes formed therein is inserted into the mold for molding the anisotropic conductive connector 11. After that, the liquid rubber in which the magnetic conductive particles are dispersed is poured into the mold, and a magnetic force is applied thereto to orient the magnetic conductive particles, curing the liquid rubber. Finally, the end portion of the conduction sheet 16 is folded back to form the laminated ground connection portion 19.

Figure 7:
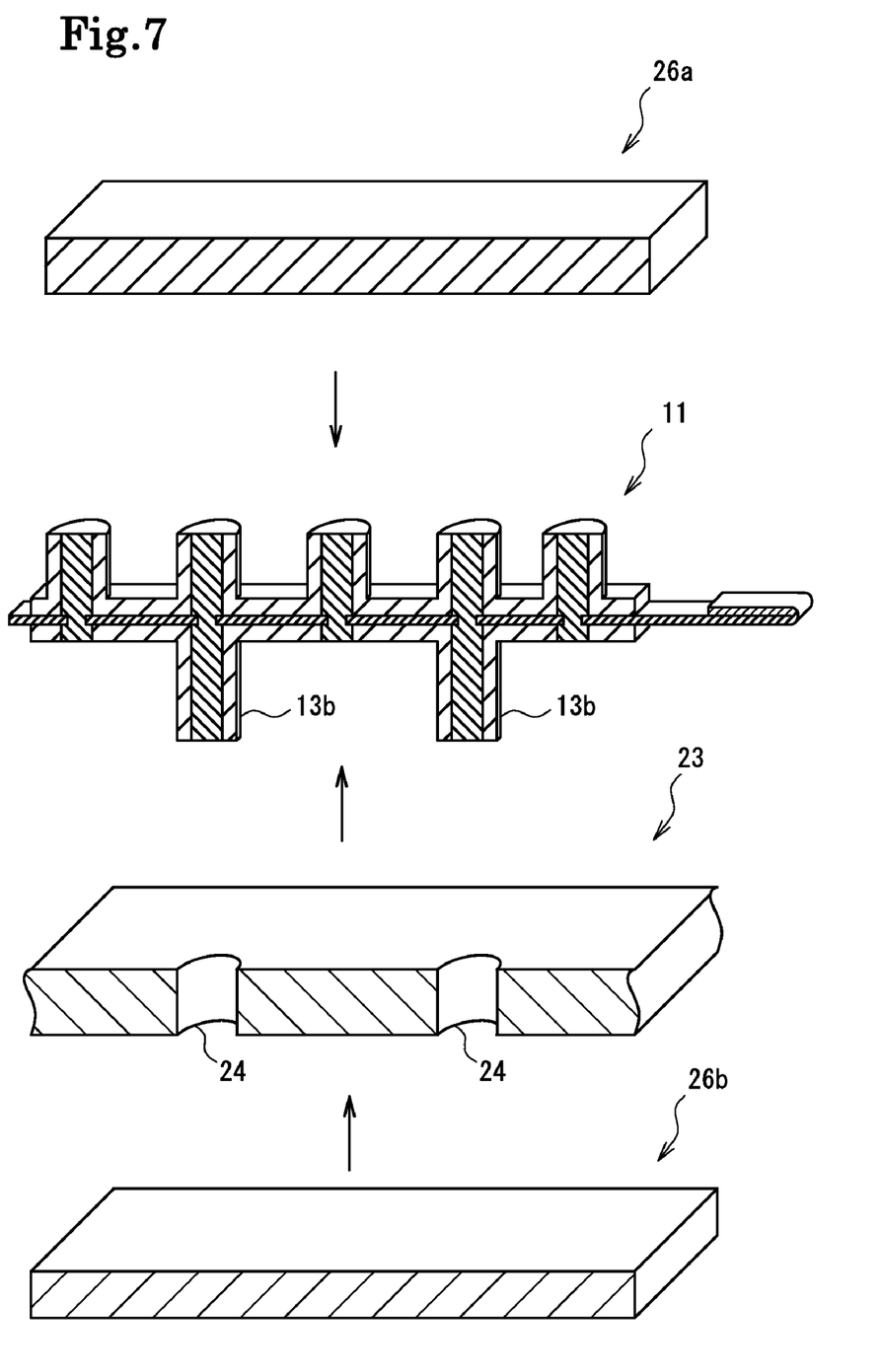
FIG. 7 is an explanatory view illustrating how the anisotropic conductive connector of FIG. 2 is assembled.

The assembling of the anisotropic conductive connector 11 to the electronic apparatus is described with reference to FIG. 7. First, the anisotropic conductive connector 11 is fitted onto a spacer 23 formed of a resin plate such as a polycarbonate plate. The spacer 23 has mounting holes 24 serving as accommodation recesses into which the protrusions 13b protruding on the lower side of the anisotropic conductive connector 11 are to be inserted. By fit-engaging the spacer 23 with the anisotropic conductive connector 11, it is possible to integrally handle the anisotropic conductive connector 11 and the spacer 23. The anisotropic conductive connector 11 integrated with the spacer 23 is held between a first object of connection 26a and a second object of connection 26b.

Figure 8:
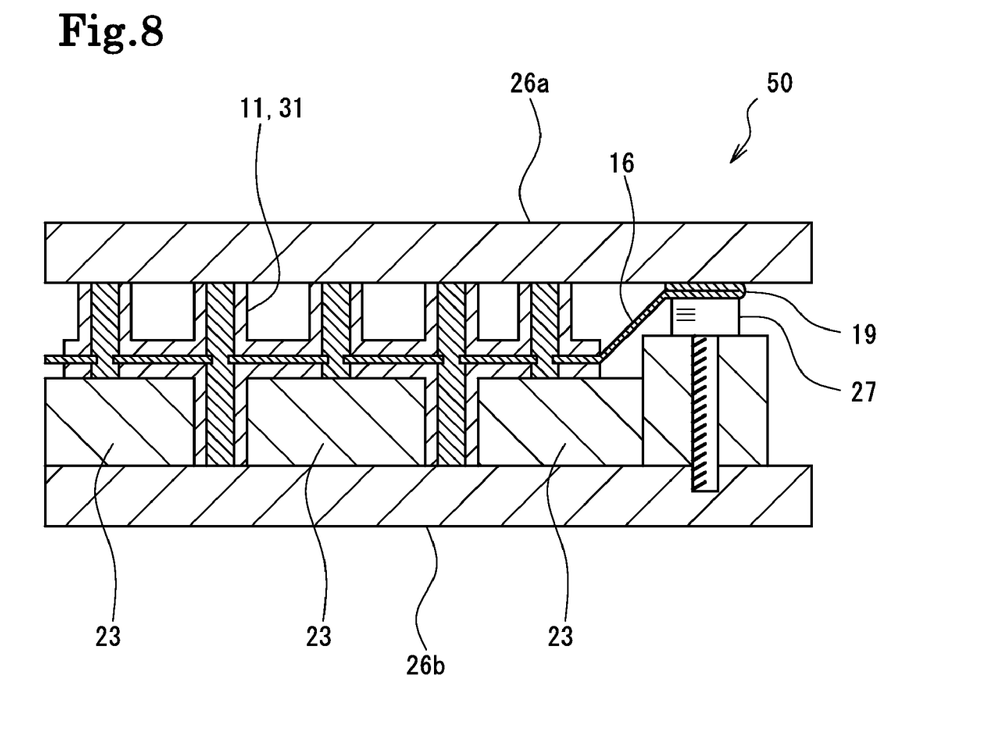
FIG. 8 is a sectional view illustrating how the anisotropic conductive connector of FIG. 2 is assembled.

The anisotropic conductive connector 11 held by the spacer 23 can be formed into a connection structure 50 as shown in FIG. 8. The anisotropic conductive connector 11 is mounted such that its upper side is in contact with the upper object of connection 26a constituting the metal portion 3 of the casing 2 of the mobile music playback apparatus 1, and that its lower side is in contact with the lower object of connection 26b, which is continuous with built-in components of the mobile music playback apparatus 1 including a battery and a circuit board. Further, fixation is effected such that one surface side of the ground connection portion 19 is grounded to the upper object of connection 26a, and that the other surface side thereof is grounded to a screw 27 for fixing the spacer 23 to the lower object of connection 26b.

Finally, the effects of the anisotropic conductive conductor 11 and the connection structure thereof are described. In the anisotropic conductive connector 11, the centers of the conducting paths 15 are somewhat offset with respect to the centers of the through-holes 20, whereby the contact surfaces 21 holding the conducting paths 15 and the conduction sheet 16 in contact with each other are secured for reliable contact. Further, due to the provision of the through-holes 20 in the conduction sheet 16, the conducting paths 15 effecting vertical connection, with the conduction sheet 16 being provided therebetween, are partially formed in the through-holes 20.

That is, continuous orientation is possible through the through-holes 20, with the magnetic conductive particles forming the conducting paths 15 not being intercepted by the conduction sheet 16, and hence it is possible to reliably effect conductive connection between the first object of connection connected to the upper electrode surfaces 18*a* exposed at one ends of the conducting paths 15 and the second object of connection connected to the lower electrode surfaces 18*b* exposed at the other ends of the conducting paths 15.

Figure 9:
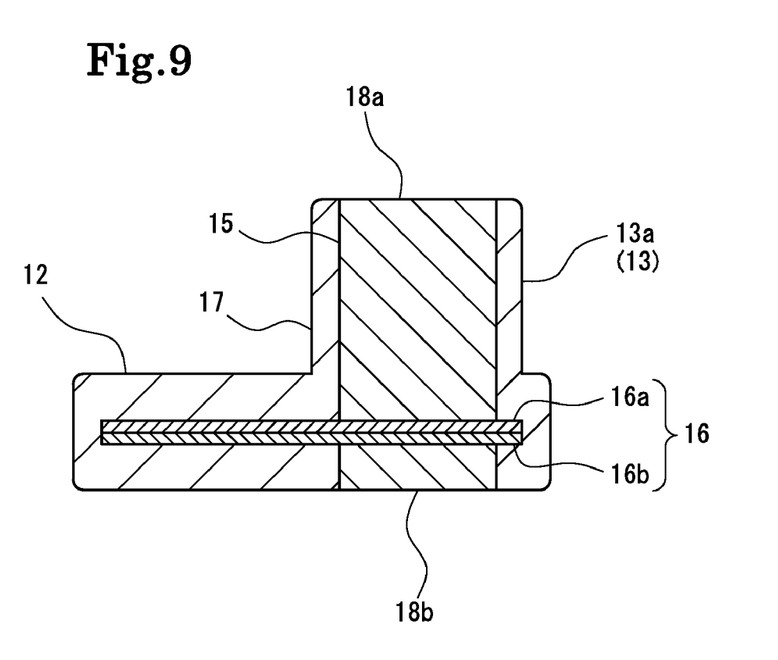
FIG. 9 is a sectional view, corresponding to FIG. 5, showing the case in which no through-holes are provided in the conduction sheet.

In particular, when, as the conduction sheet 16, there is used a laminate film or a laminate plate formed by laminating the resin film 16*b* or resin plate 16*b*, or a laminate sheet such as a circuit board, there is formed on one surface side of the conduction sheet 16 a conduction layer where the metal layer 16*a* is exposed, and there is formed on the other surface side of the conduction sheet an insulation layer where the base material such as the resin film 16*b* or resin plate 16*b* is exposed. Thus, as shown in FIG. 9, when no through-holes 20 are provided in the conduction sheet 16, the conducting paths 15 are cut off by the insulation layer, and the conduction between the upper electrode surface 18*a* side and the lower electrode surface 18*b* side through the conducting paths 15 is intercepted. However, in the anisotropic conductive connector 11, due to the provision of the through-holes 20, no such problem is involved.

When a circuit board is used as the conduction sheet 16, it is possible to effect not only conductive connection between the first object of connection and the second object of connection but also conductive connection of the circuit board, and hence it is also possible to effect ground connection of the circuit board.

Further, not only the conducting paths 15 are formed in the through-holes 20, but also the insulating portion 17 extends through the through-holes 20. Thus, the portions of the insulating portion 17 situated on the upper and lower surfaces of the conduction sheet 16 are connected together, and hence the adhesion between the conduction sheet 16 and the insulating portion 17 is enhanced, and the insulating portion 17 is not easily separated from the conduction sheet 16.

In the ground connection portion 19, the end portion of the conduction sheet 16 is folded back, and hence the upper surface side of the ground connection portion 19 can be brought into contact with the first object of connection, and the lower surface side of the ground connection portion 19 can be brought into contact with the second object of connection. Further, through an increase in thickness due to the folding back, it is possible to reliably effect conductive connection of both sides of the ground connection portion 19 with another member. In particular, when a double-faced tape 22 formed of a foam urethane base material or the like is used, it is possible to provide elasticity in addition to the increase in thickness, making it possible to enlarge the permissible range for the distance width between the first object of connection and the second object of connection holding the ground connection portion 19 therebetween. In the case in which the conduction sheet 16 with the resin film 16*b* laminated is used, even when one surface of the conduction sheet 16 is conductive, the other surface thereof is insulating, and hence no conductive portion is exposed on both surfaces unless the conduction sheet 16 is folded back. This, however, leads to no problem since the conduction sheet is folded back.

In the anisotropic conductive connector 11, in effecting conduction between the upper object of connection 26*a* in contact with the upper electrode surfaces 18*a* and the lower object of connection 26*b* in contact with the lower electrode surfaces 18*b*, the conducting paths 15 are electrically continuous with the conduction sheet 16, and hence even when there is a problem in some conducting paths 15 or the objects of connection 26*a* and 26*b* are out of contact with each other, it is possible to reliably attain conduction between the upper object of connection 26*a* and the lower object of connection 26*b*.

Further, an end portion of the conduction sheet 16 constitutes the ground connection portion 19, and the ground connection portion 19 comes into contact with the upper object of connection 26*a* and the lower object of connection 26*b* separately from the conducting paths, and hence it is possible to reliably attain conduction between the upper object of connection 26*a* and the lower object of connection 26*b*.

In the connection structure of the anisotropic conductive connector 11, by fit-engaging the anisotropic conductive connector 11 with the spacer 23, the small anisotropic conductive connector 11 can be handled integrally with the spacer 23. Since the anisotropic conductive connector 11 is integrated with the spacer 23, the operation of mounting the anisotropic conductive connector 11 is facilitated, and it is possible to attain an improvement in terms of workability when attaching the anisotropic conductive connector 11 to the electronic apparatus.

Figure 10:
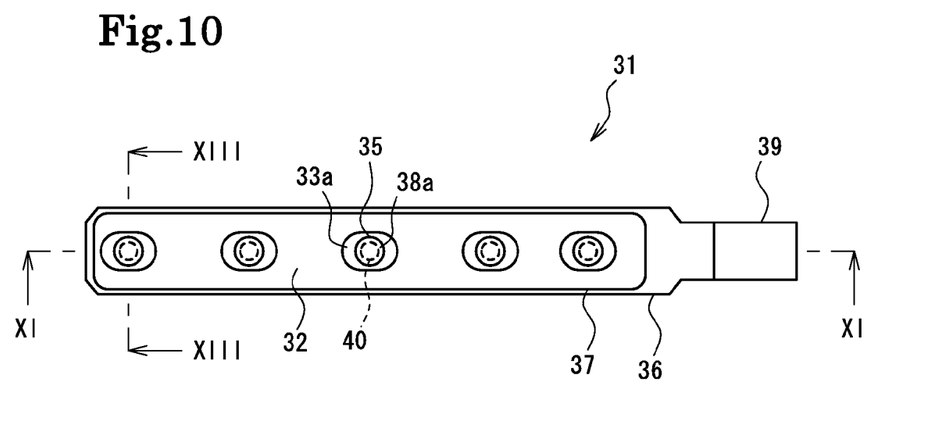
FIG. 10 is a plan view of an anisotropic conductive connector according to another embodiment of the present invention.
Figure 11:
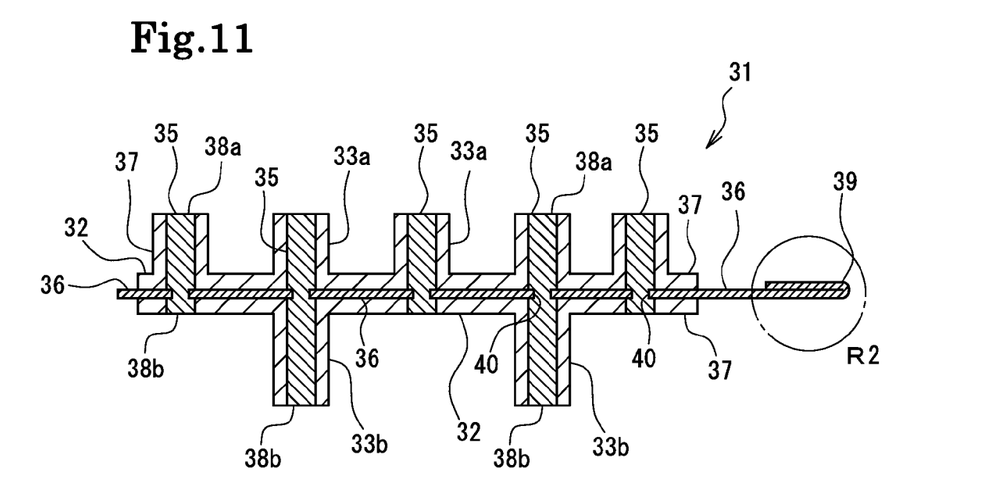
FIG. 11 is a sectional view of the anisotropic conductive connector of FIG. 10, taken along the line XI-XI.
Figure 12:
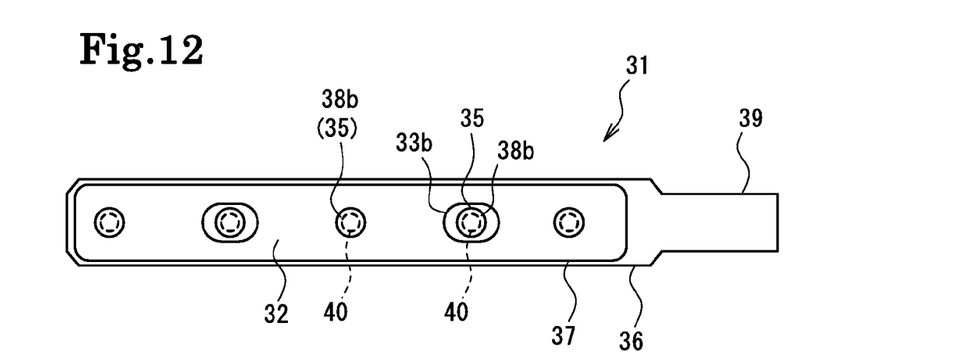
FIG. 12 is a bottom view of the anisotropic conductive connector of FIG. 10.
Figure 13:
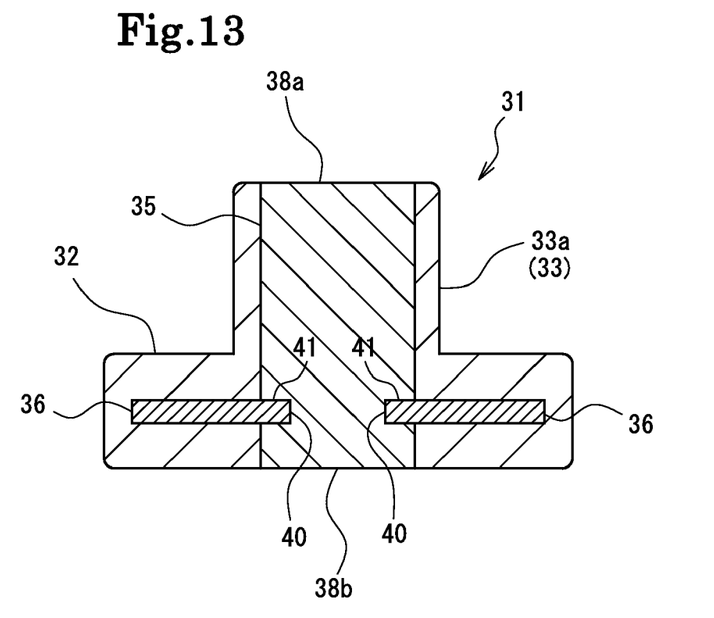
FIG. 13 is an enlarged sectional view of the anisotropic conductive connector of FIG. 10, taken along the line XIII-XIII.

Second Embodiment (FIGS. 10 through 13): FIG. 10 is a plan view of an anisotropic conductive connector 31 according to the second embodiment of the present invention, FIGS. 11 and 13 are sectional views thereof, and FIG. 12 is a bottom view thereof. The anisotropic conductive connector 31 differs from the anisotropic conductive connector 11 of the above-mentioned embodiment in the size of through-holes 40 provided in a conduction sheet 36 and the positions where protrusions 33 (upper protrusions 33*a* and lower protrusions 33*b*) are provided.

As shown in FIGS. 10 and 12, in the anisotropic conductive connector 31, the through-holes 40 are formed in the conduction sheet 36 at positions in the center line of the anisotropic conductive connector 31. Further, the upper protrusions 33*a* and the lower protrusions 33*b* are also formed at positions in the center line of the anisotropic conductive connector 31. The portion where each conducting path 35 and the conduction sheet 36 cross each other is described with reference to FIG. 13. Each through-hole 40 provided in the conduction sheet 36 and the conducting path 35 in which magnetic conductive particles are oriented are formed concentrically. However, the size of the through-hole 40 is smaller as compared with the diameter of the conducting path 35, and hence, at the edge of the through-hole 40, there is formed a contact surface 41 where the conduction sheet 36 and the conducting path 35 are in contact with each other. In other words, the diameter of the conducting path 35 is larger than that of the through-hole 40, and the conducting path 35 is arranged such that the central axis of the conducting path 35 extending in the orientation direction and the center of the through-hole 40 are substantially concentric, with a part of the conducting path 35 extending through while stopping the through-hole 40, and with the portion of the conducting path 35 other than that stopping the through-hole 40 overlapping the hole edge of the through-hole 40. As in the conduction sheet 16 of the first embodiment, in the ground connection portion 39, an end portion of the conduction sheet 36 is folded back and laminated. As shown in FIG. 6(A), the laminated portion in the region R2 may be simply folded back and laminated, or, as shown in FIG. 6(B), the portion folded back may be fixed in position by the double-faced tape 22. As in the case of the conduction sheet 16 of the first embodiment, the conduction sheet 36 is formed by providing a metal layer 36*a* on a resin film 36*b*.

As in the case of the anisotropic conductive connector 11 of the first embodiment, the anisotropic conductive connector 31 can be formed into a connection structure 50 to be incorporated into a mobile music playback apparatus 1. As shown in FIG. 8, the anisotropic conductive connector 31 is mounted such that its upper side is in contact with the upper object of connection 26*a* constituting the metal portion 3 of the casing 2 of the mobile music playback apparatus 1, and that its lower side is in contact with the lower object of connection 26*b*, which is continuous with built-in components including a battery and a circuit board. Further, fixation is effected such that one surface side of the ground connection portion 39 is grounded to the upper object of connection 26*a*, and that the other surface side thereof is grounded to a screw 27 for fixing the spacer 23 to the lower object of connection 26*b*.

In the anisotropic conductive connector 31, the diameter of the conducting paths 35 is larger than the diameter of the through-holes 40, and hence the contact surfaces 41 where the conducting paths 35 and the conduction sheet 36 are held in contact with each other are secured, effecting reliable contact therebetween. Further, since the through-holes 40 are provided in the conduction sheet 36, the magnetic conductive particles forming the conducting paths 35 are not intercepted by the conduction sheet 36, enabling continuous orientation through the through-holes 40, and hence conductive connection can be reliably effected between the first object of connection connected to the upper electrode surfaces 38*a* of the conducting paths 35 and the second object of connection connected to the lower electrode surfaces 38*b* of the conducting paths 35.

Modifications of the Embodiments: Modifications of the anisotropic conductive connector 11, 31 of the above-mentioned embodiments are described. The number, configuration, layout, etc. of the protrusions 13, 33 of the anisotropic conductive connector 11, 31 allow changes as appropriate. That is, the five protrusions 13*a*, 33*a* protruding on the upper side of the anisotropic conductive connector 11, 31 and the two protrusions 13*b*, 33*b*, protruding on the lower side thereof, are only shown by way of example, and the number, configuration, and layout of these protrusions may be changed.

While in the above-described embodiments, the conduction sheet 16, 36 is formed in a single layer in the planar direction of the base body portion 12, 32, it is also possible to stack together a plurality of conduction sheets in the thickness direction of the anisotropic conductive connector, with rubber-like elastic members being sandwiched therebetween. Further, the plurality of layers of conduction sheets are superimposed one upon the other at the ground connection portion, whereby the contact surfaces 21, 41 of the conducting paths 15, 35 and the conduction sheets 16, 36 expand, thereby achieving a further improvement in terms of conductivity.

Figure 14:
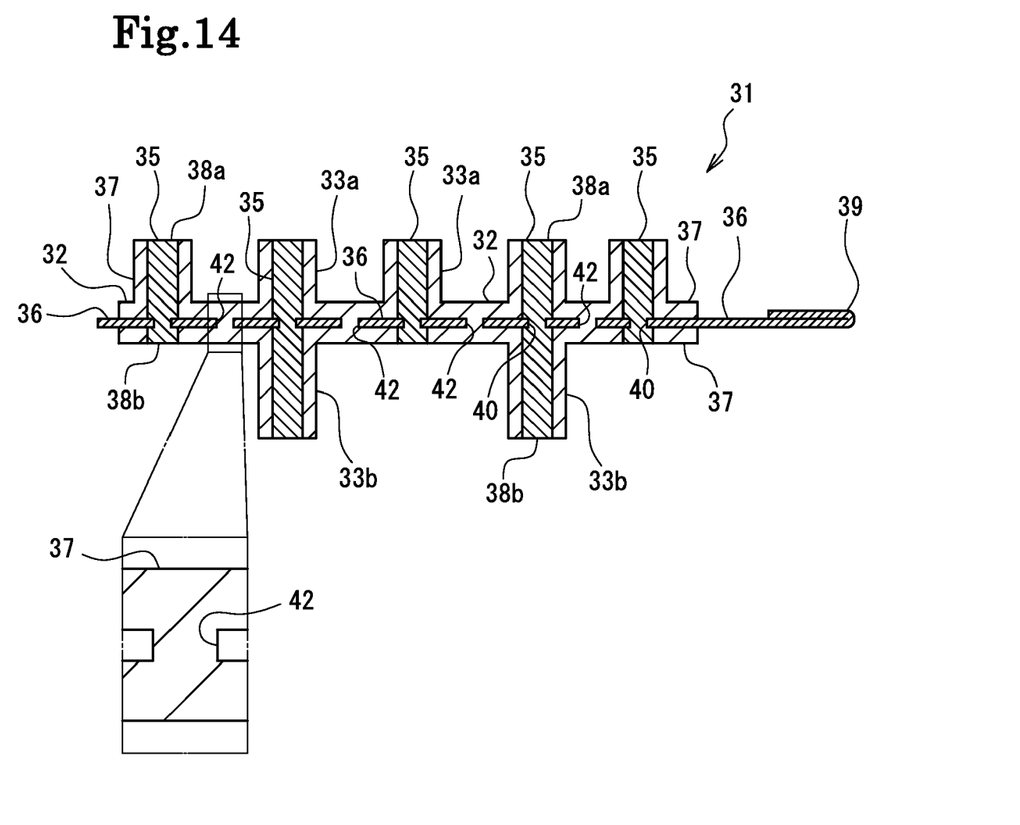
FIG. 14 is a sectional view, corresponding to FIG. 11, of a modification of the anisotropic conductive connector of FIG. 10.

The conduction sheet 16, 36 may be provided with insulating portion connection holes 42 that are separate from the through-holes 20, 40 through which the conducting paths 15, 35 extend. In the example shown in FIG. 14, the insulating portion connection holes 42 are provided in the anisotropic conductive connector 31 of the second embodiment. The insulating portion connection holes 42 are the same as the through-holes 20, 40 in that they are through-holes extending through the conduction sheet 16, 36. However, they differ from the through-holes 20, 40 in that no conducting paths 15, 35 are formed in the through-holes, with the through-holes being stopped solely with insulating portion 17, 37. By providing the insulating portion connection holes 42, it is possible to connect to each other the portions of the insulating portion 17, 37 formed on the upper and lower sides of the conduction sheet 16, 36, making it possible to firmly hold the insulating portion 17, 37 in intimate contact with the conduction sheet 16, 36. The formation of the insulating portion connection holes 42 is especially effective in the modification of the anisotropic conductive connector 31 of the second embodiment, in which the portions of the insulating portion 37 on the upper and lower sides of the conduction sheet 36 are not connected together anywhere except for the insulating portion connection holes 42.

What is claimed is:

1. An anisotropic conductive connector comprising:
   a plurality of conducting paths formed by magnetic conductive particles oriented in a predetermined direction; and
   an insulating portion formed of an elastic member covering the conducting paths, conduction being effected by bringing both end surfaces of each conducting path into contact with objects of connection to be brought into conductive connection,
   a conductive metal portion having a plurality of through-holes and crossing the conducting paths,
   wherein the magnetic conductive particles of the conducting paths pass through the through-holes, and wherein hole edges of the through-holes have contact surfaces in contact with the magnetic conductive particles to effect conductive connection with the metal portion.

2. An anisotropic conductive connector according to claim 1, wherein the conducting paths are arranged such that central axes in the orientation direction of the conducting paths are offset from the centers of the through-holes, causing a part of the conducting paths to pass through a part of the through-holes and enabling the remainder of the conducting paths to overlap the hole edges of the through-holes.

3. An anisotropic conductive connector according to claim 1, wherein the metal portion is a metal layer provided on a conduction sheet.

4. An anisotropic conductive connector according to claim 1, comprising: a base body portion having the metal portion and the insulating portion formed of an elastic member covering the metal portion and the base body portion extending to cross the conducting paths, wherein, at an end of this base body portion, a ground connection portion where the metal portion is exposed for contact with the objects of connection are provided.

5. An anisotropic conductive connector according to claim 4, wherein the ground connection portion is formed by folding back the metal portion.

6. A connection structure of an anisotropic conductive connector, comprising: an anisotropic conductive connector as claimed in claim 5, the connection structure including the objects of connection that are to be brought into conductive connection and connected to the anisotropic conductive connector,
   wherein conduction is effected by bringing both surfaces of the ground connection portion into contact with the objects of connection.

7. A connection structure of an anisotropic conductive connector according to claim 6, further comprising a spacer having accommodation recesses for accommodating the conducting paths protruding from the base body portion of the anisotropic conductive connector, wherein the conducting paths of the anisotropic conductive connector are engaged with the accommodation recesses of the spacer to integrate the anisotropic conductive connector with the spacer, with the anisotropic conductive connector being brought into contact with the objects of connection in this state to effect conduction.

8. A connection structure of an anisotropic conductive connector, comprising: an anisotropic conductive connector as claimed in claim 4, the connection structure including the objects of connection that are to be brought into conductive connection and connected to the anisotropic conductive connector, wherein conduction is effected by bringing both surfaces of the ground connection portion into contact with the objects of connection.

9. A connection structure of an anisotropic conductive connector according to claim 8, further comprising a spacer having accommodation recesses for accommodating the conducting paths protruding from the base body portion of the anisotropic conductive connector, wherein the conducting paths of the anisotropic conductive connector are engaged with the accommodation recesses of the spacer to integrate the anisotropic conductive connector with the spacer, with the anisotropic conductive connector being brought into contact with the objects of connection in this state to effect conduction.

10. An anisotropic conductive connector according to claim 1, wherein the diameter of the conducting paths is larger than the diameter of the through-holes, and the conducting paths are arranged such that central axes in the orientation direction of the conducting paths are substantially coaxial with the centers of the through-holes, with a part of the conducting paths stopping the through-holes while extending therethrough, and with the remainder of the conducting paths overlapping the hole edges of the through-holes.

11. An anisotropic conductive connector according to claim 10, wherein the metal portion is a metal layer provided on a conduction sheet.

12. An anisotropic conductive connector according to claim 10, comprising: a base body portion having the metal portion and the insulating portion formed of an elastic member covering the metal portion and the base body portion extending to cross the conducting paths, wherein, at an end of this base body portion, a ground connection portion where the metal portion is exposed for contact with the objects of connection are provided.

13. An anisotropic conductive connector according to claim 12, wherein the ground connection portion is formed by folding back the metal portion.

14. A connection structure of an anisotropic conductive connector, comprising: an anisotropic conductive connector as claimed in claim 13, the connection structure including the objects of connection to be brought into conductive connection and connected to the anisotropic conductive connector, wherein conduction is effected by bringing both surfaces of the ground connection portion into contact with the objects of connection.

15. A connection structure of an anisotropic conductive connector according to claim 14, further comprising a spacer having accommodation recesses for accommodating the conducting paths protruding from the base body portion of the anisotropic conductive connector, wherein the conducting paths of the anisotropic conductive connector are engaged with the accommodation recesses of the spacer to integrate the anisotropic conductive connector with the spacer, with the anisotropic conductive connector being brought into contact with the objects of connection in this state to effect conduction.

16. A connection structure of an anisotropic conductive connector, comprising: an anisotropic conductive connector as claimed in claim 12, the connection structure including the objects of connection to be brought into conductive connection and connected to the anisotropic conductive connector, wherein conduction is effected by bringing both surfaces of the ground connection portion into contact with the objects of connection.

17. A connection structure of an anisotropic conductive connector according to claim 16, further comprising a spacer having accommodation recesses for accommodating the conducting paths protruding from the base body portion of the anisotropic conductive connector, wherein the conducting paths of the anisotropic conductive connector are engaged with the accommodation recesses of the spacer to integrate the anisotropic conductive connector with the spacer, with the anisotropic conductive connector being brought into contact with the objects of connection in this state to effect conduction.

18. An anisotropic conductive connector comprising:

a plurality of conducting paths formed by magnetic conductive particles oriented in a predetermined direction each of the plurality of conductive paths including a pair of end surfaces configured for conductive connection to a respective object of connection; and an insulating portion formed of an elastic member covering the conducting paths and exposing each of the end surfaces, a metal portion crossing the conductive paths and having a plurality of through-holes, wherein the magnetic conductive particles of the conducting paths pass through the through-holes, and wherein hole edges of the through-holes have contact surfaces in contact with the magnetic conductive particles to effect conductive connection with the metal portion.

* * * * *